US00RE43818E

(19) United States
(12) Reissued Patent
Lim

(10) Patent Number: US RE43,818 E
(45) Date of Reissued Patent: Nov. 20, 2012

(54) FABRICATION OF AN INTEGRATED CIRCUIT PACKAGE

(75) Inventor: Chee Chian Lim, Alor Gajah Melaka (MY)

(73) Assignee: Infineon Technologies AG, Munich (DE)

(21) Appl. No.: 13/299,033

(22) Filed: Nov. 17, 2011

Related U.S. Patent Documents

Reissue of:
(64) Patent No.: 7,618,845
Issued: Nov. 17, 2009
Appl. No.: 11/513,826
Filed: Aug. 31, 2006

U.S. Applications:
(63) Continuation-in-part of application No. PCT/SG2006/000017, filed on Feb. 1, 2006.

(51) Int. Cl.
*H01L 21/00* (2006.01)
*H01L 23/28* (2006.01)
*H01L 23/48* (2006.01)
*H01L 23/495* (2006.01)

(52) U.S. Cl. ..... 438/112; 257/695; 257/676; 257/796; 257/787

(58) Field of Classification Search ..... 438/112, 438/25–26, 123, 124; 257/787, 796, 666, 257/675, 676, 66, 678, 692, E23.039, E23.051; 361/813
See application file for complete search history.

(56) References Cited

U.S. PATENT DOCUMENTS

| | | | |
|---|---|---|---|
| 6,348,726 | B1 | 2/2002 | Bayan et al. |
| 6,399,415 | B1 | 6/2002 | Bayan et al. |
| 7,109,572 | B2 | 9/2006 | Fee et al. |
| 7,183,132 | B2 | 2/2007 | Nakamura |
| 7,301,225 | B2 | 11/2007 | Wong et al. |
| 2001/0001069 | A1 | 5/2001 | Huang et al. |
| 2001/0045638 | A1 | 11/2001 | Ohgiyama et al. |

(Continued)

FOREIGN PATENT DOCUMENTS

EP 1 465 253 A2 10/2004

(Continued)

OTHER PUBLICATIONS

German Office Action, Filing No. 11 2006 003 664.5-33, Dated Aug. 17, 2010, 10 pages.

*Primary Examiner* — Fernando L Toledo
*Assistant Examiner* — Karen Kusumakar
(74) *Attorney, Agent, or Firm* — Slater & Matsil, L.L.P.

(57) ABSTRACT

A QFN integrated circuit is mounted on a leadframe having multiple lead lands and resin material encapsulates the integrated circuit leaving the lead lands exposed. Subsequently a sawing operation divides the lead lands into multiple leads, and the leadframe and resin material are partitioned to form packages. The pitch of the resultant leads is not limited by the pitch of the lead lands of the leadframe, so the leadframe can be of the relatively cheap generic leadframe variety, in which the pitch of the lead lands is higher than the desired pitch of the leads of the completed package. The sawing operation may further include reshaping the diepad area of the leadframe to produce heat sink fins, for improved heat dissipation. The proposed process is suitable both to produce packages including only a single integrated circuit, and also to produce multi-chip modules.

20 Claims, 19 Drawing Sheets

U.S. PATENT DOCUMENTS

| | | | |
|---|---|---|---|
| 2002/0125557 | A1 | 9/2002 | Chen et al. |
| 2002/0168796 | A1 | 11/2002 | Shimanuki et al. |
| 2003/0042581 | A1 | 3/2003 | Fee et al. |
| 2003/0234454 | A1 | 12/2003 | Pedron et al. |
| 2004/0080030 | A1 | 4/2004 | Fee et al. |
| 2004/0097016 | A1 | 5/2004 | Yee et al. |
| 2004/0164399 | A1 | 8/2004 | Saitoh |
| 2004/0195661 | A1 | 10/2004 | Shirasaka |
| 2005/0023655 | A1 | 2/2005 | Fee et al. |
| 2005/0116327 | A1 | 6/2005 | Danno et al. |

FOREIGN PATENT DOCUMENTS

| | | |
|---|---|---|
| WO | WO 2006 096267 | 9/2006 |

FABRICATION OF AN INTEGRATED CIRCUIT PACKAGE

Matter enclosed in heavy brackets [ ] appears in the original patent but forms no part of this reissue specification; matter printed in italics indicates the additions made by reissue.

[This application] *This application is a reissue application of U.S. Pat. No. 7,618,845 B2, entitled "Fabrication of an Integrated Circuit Package," issued on Nov. 17, 2009, which* is a continuation-in-part of co-pending International Application No. PCT/SG2006/000017, filed Feb. 1, 2006, which is incorporated herein by reference.

TECHNICAL FIELD

The present invention relates to a method for fabricating an integrated circuit package, particularly but not exhaustively to a method for fabricating a quad-flat non-leaded (QFN) integrated circuit package, and packages produced by the method.

BACKGROUND

A QFN integrated circuit is a semiconductor device having a generally-rectangular (usually square) upper surface with electrical contacts along its edges. Existing techniques for packaging a QFN integrated circuit to produce a package make use of a leadframe produced by etching. The packaging technique is illustrated below with reference to FIG. 1, which shows a number of views parallel to the major plane of the QFN chip being mounted.

As shown in FIG. 1(a), in an initial step a leadframe having a diepad 1 and leads 3, 5 is positioned on a tape 7. It should be understood that FIG. 1(a) shows only a portion of the leadframe and the tape 7: both the tape 7 and leadframe extend laterally to an indefinite length to either side of the diagram. Die bonding is then performed to place a QFN die 9 onto diepad 1, as shown in FIG. 1(b).

Subsequently, as shown in FIG. 1(c), a wirebonding operation is performed to form wire bonds 11 between contacts on the upper surface of the die 9 and the leads 3, 5. Then, as shown in FIG. 1(d), a molding process is performed in which resin material 8 is formed encapsulating the die 9 and the leads 3, 5. Again, the resin material 8 extends laterally to either side of the figure. The resin material 8 is then cured. Then, as shown in FIG. 1(e), the tape 7 is removed, resulting in the structure of FIG. 1(f). At this stage, lead tape residues are removed by cleaning, and Ag plating is performed.

Then, as shown in FIG. 1(g), strip lamination is performed, resulting in a foil 6 on the side of the resin material 8 opposite the leadframe. Then as shown in FIG. 1(h) unit singulation is performed (this is shown schematically as slots 10 being formed in the resin material 8), to form individual package units 14.

As shown in FIG. 1(i), each singulated unit 14 is tested, using contact pins 13 (the foil 6 is omitted from the figure for simplicity). Then as shown in FIG. 1(j), it is picked up from foil 6 using a lifter unit 15 and a needle 16, and placed in a desired location for later use as shown in FIG. 1(k). Typically, this is on a reeled tape including flexible layers 18.

Note that the process above uses an etched leadframe. This is because conventional stamped leadframes cannot be used to produce leadframes with very tiny lead pitch (e.g., under 0.8 mm), since the leadframe punching tool would be easily broken. However, the use of the etched leadframes with small and/or custom designed lead pitch leads to a number of disadvantages.

Firstly, as the lead pitch becomes smaller, the cost of producing the etched leadframes is rising. Practically speaking, it is very difficult to produce an etched leadframe with a pitch less than 0.5 mm, and certainly very expensive to do so.

Secondly, since etched leadframes are usually pre-designed and etched at a specialist manufacturing location, making any modification of the design is logistically difficult, leading to rigidity in the process.

Thirdly, the presence of the tape 7 causes "lead bouncing," which causes wire bonding difficulties such as bonded wire stress necks and crack stitches, and therefore marginal bonding reliability concerns.

Fourthly, taping the individual tiny leads 3, 5 causes mold resin bleeding and the issue of mold flashes. This may lead to a solderability failure.

SUMMARY OF THE INVENTION

The present invention aims to provide new and useful techniques for packaging an integrated circuit, and to provide new and useful packages.

In various embodiments, the present invention proposes that an integrated circuit is mounted on a leadframe having multiple lead lands, and that subsequently a shaping operation is performed on the leadframe to divide at least one of the lead lands into multiple leads.

Note that the pitch of the final leads is not limited by the pitch of the lead lands of the leadframe. This means that the leadframe can be a relatively cheap generic leadframe in which the pitch of the lead lands is higher than the desired pitch of the leads of the completed package.

Furthermore, a single type of generic leadframe may be used to produce packages having a range of lead pitches by varying how the partitioning process is carried out. The designer of the integrated circuit package can choose whatever pitch is most suitable for the application without being limited by the initial configuration of the lead lines.

From another point of view, since the final configuration of the leads is determined by the shaping operation, it does not have to be determined at the time that the leadframe is manufactured. This means gives much increased flexibility to the designer of the integrated circuit package.

Wire bonding may be performed prior to the shaping of the lead lands. The lead lands may be relatively wide (i.e., before they have been partitioned), so that the wire bonding may be performed more effectively, typically producing a low level of lead bouncing.

Furthermore, the process may include taping and molding/encapsulation before the shaping of the lead lands, at a time when the lead lands are larger than the leads of the completed package. The greater size of the lead lands may result in reduced mold resin bleeding and fewer flashes. Thus, the molding process may be more robust.

The sawing operation may optionally include reshaping the leadframe to produce heat sink fins, which may have the advantage of improved heat dissipation.

The proposed process is suitable both to produce packages including only a single integrated circuits (i.e., the QFN integrated circuit), and also packaging including multiple dies, so-called MCM (multi-chip modules).

The leadframe may be a stamped or etched leadframe.

In further aspects, the invention provides a package produced by the method, and the leadframe used in the method.

The leadframe typically includes a diepad region and at least one lead land located to a respective side of the diepad region. The lead land is preferably substantially as long in the direction parallel to side of the diepad region as the side of a typical QFN integrated circuit. For example, the lead land may be at least 2 mm in length in that direction, or at least 4 mm in length in that direction. It is typically at least as long, and more typically at least twice as long, as its extension in the direction in which it is spaced from the diepad.

In a specific expression of the invention there is provided a method of packaging a QFN integrated circuit. The QFN integrated circuit is located on a diepad of a leadframe including one or more lead lands extending in a direction parallel to an adjacent side of the diepad. Wire bonds are formed between electrical contacts of the integrated circuit and the lead lands of the leadframe. The integrated circuit and the leadframe are encapsulated in a resin material, leaving a portion of the lead lands exposed. One or more of the lead lands are shaped in a direction perpendicular to an adjacent side of the diepad to divide the one or more lead lands into multiple respective leads.

BRIEF DESCRIPTION OF THE DRAWINGS

Non-limiting embodiments of the invention will now be described for the sake of example only with reference to the following figures, in which.

DETAILED DESCRIPTION OF ILLUSTRATIVE EMBODIMENTS

Figure 1A:
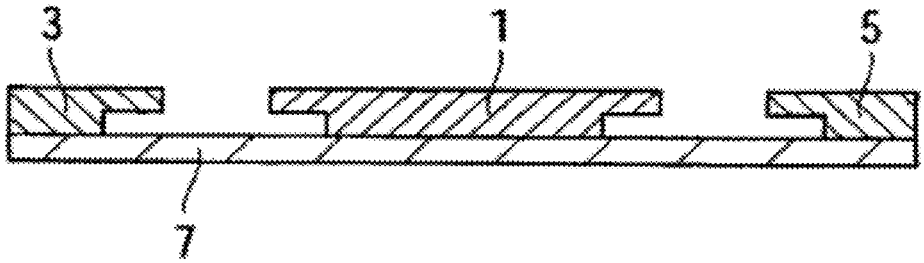
FIG 1A (PRIOR ART)
FIG. 1, which is composed of FIGS. 1(a) to 1(k), shows a prior art packaging process.
Figure 1B:
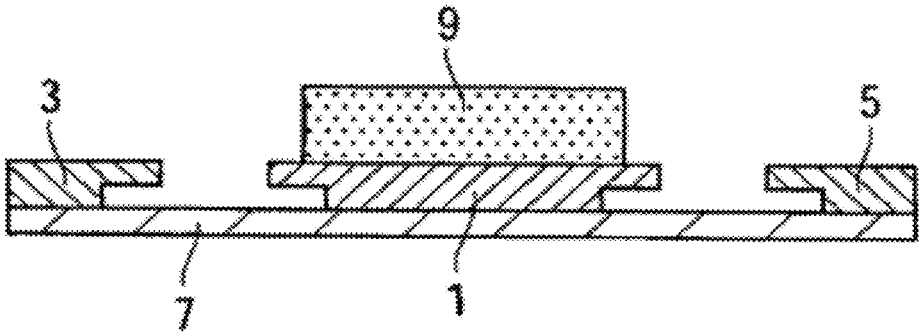
FIG 1B (PRIOR ART)
Figure 1C:
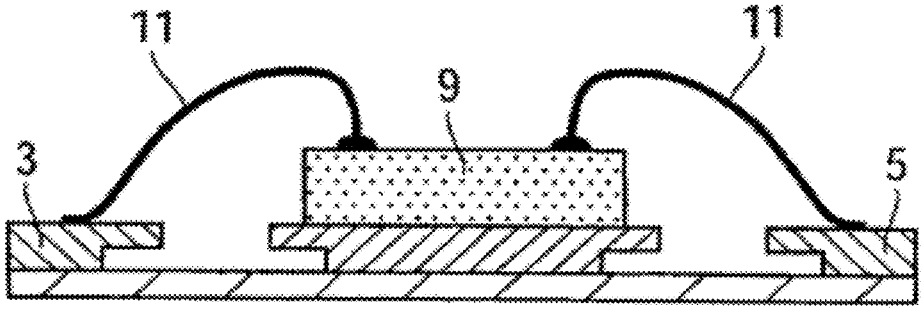
FIG 1C (PRIOR ART)
Figure 1D:
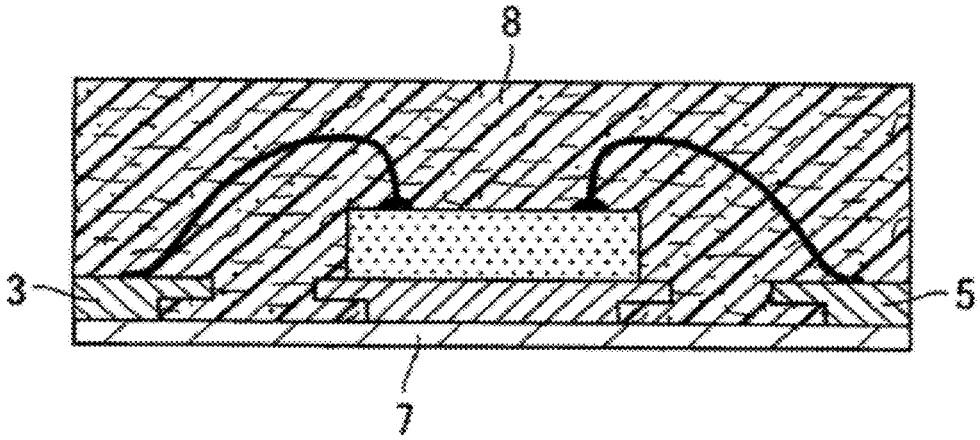
FIG 1D (PRIOR ART)
Figure 1E:
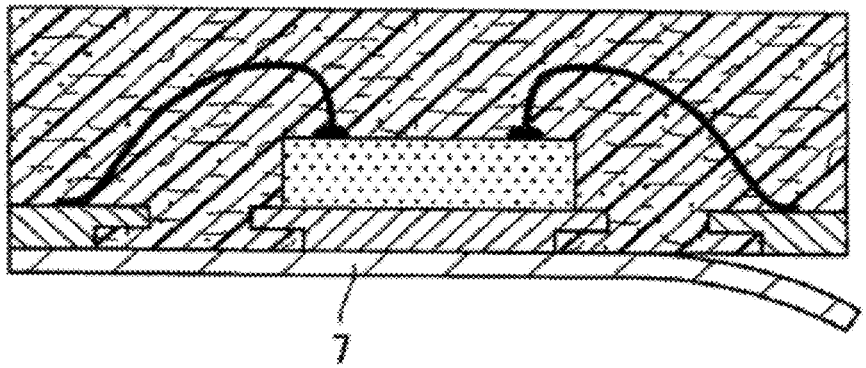
FIG 1E (PRIOR ART)
Figure 1F:
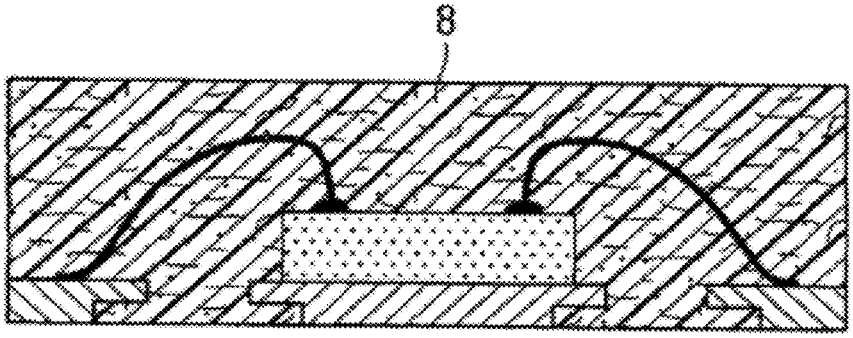
FIG 1F (PRIOR ART)
Figure 1G:
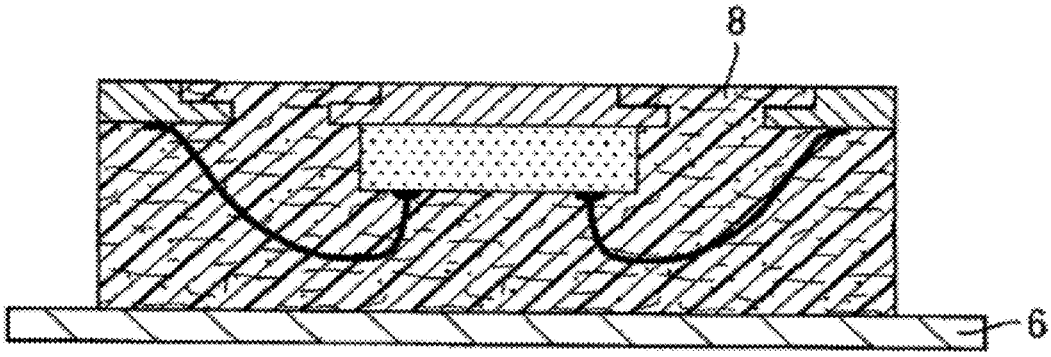
FIG 1G (PRIOR ART)
Figure 1H:
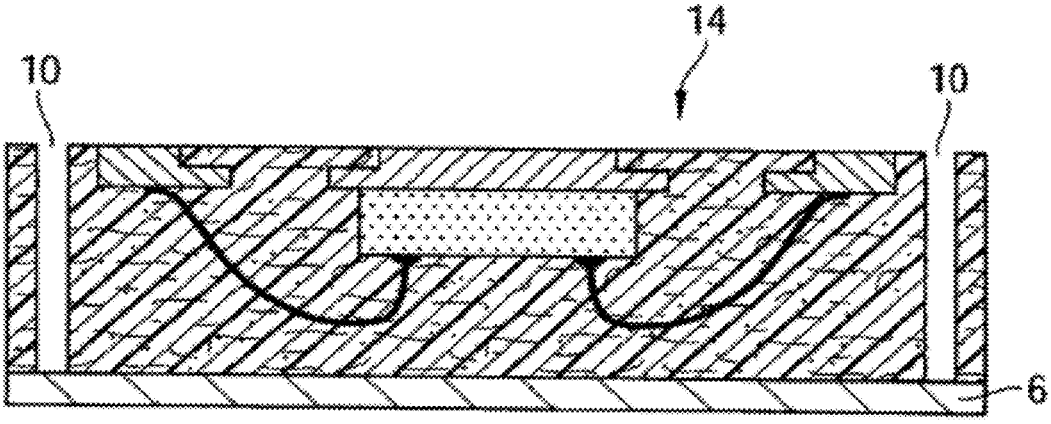
FIG 1H (PRIOR ART)
Figure 1I:
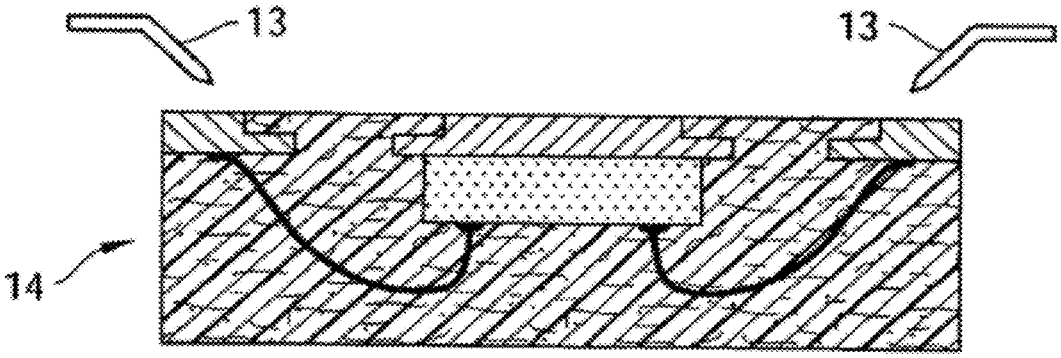
FIG 1I (PRIOR ART)
Figure 1J:
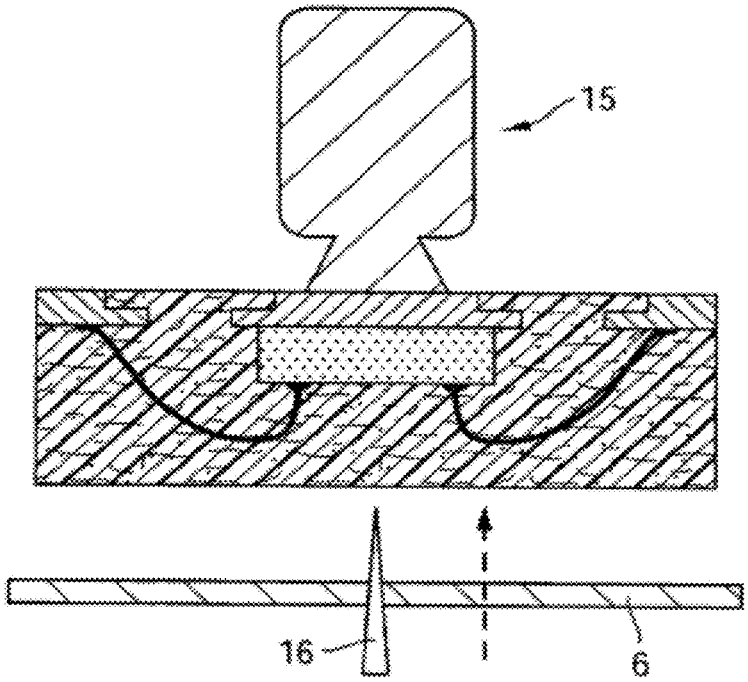
FIG 1J (PRIOR ART)
Figure 1K:
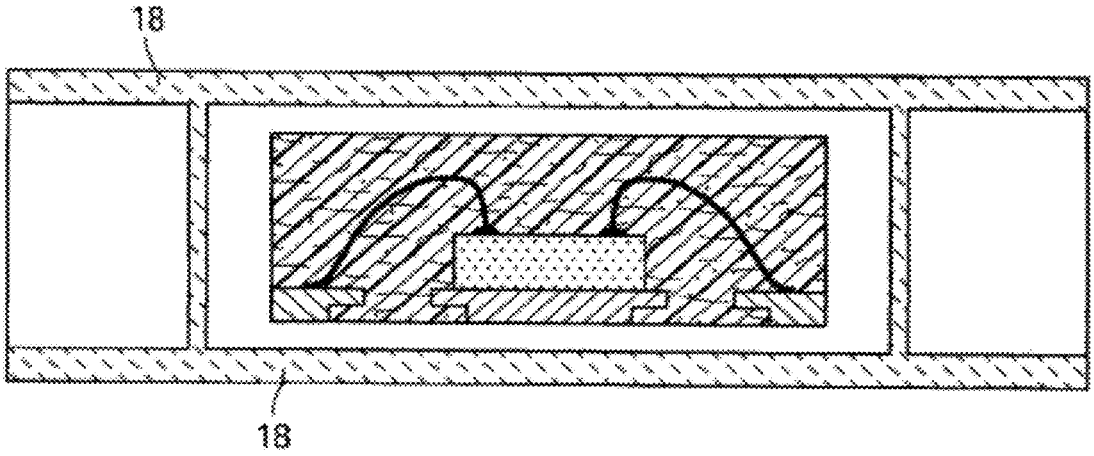
FIG 1K (PRIOR ART)
Figure 2:
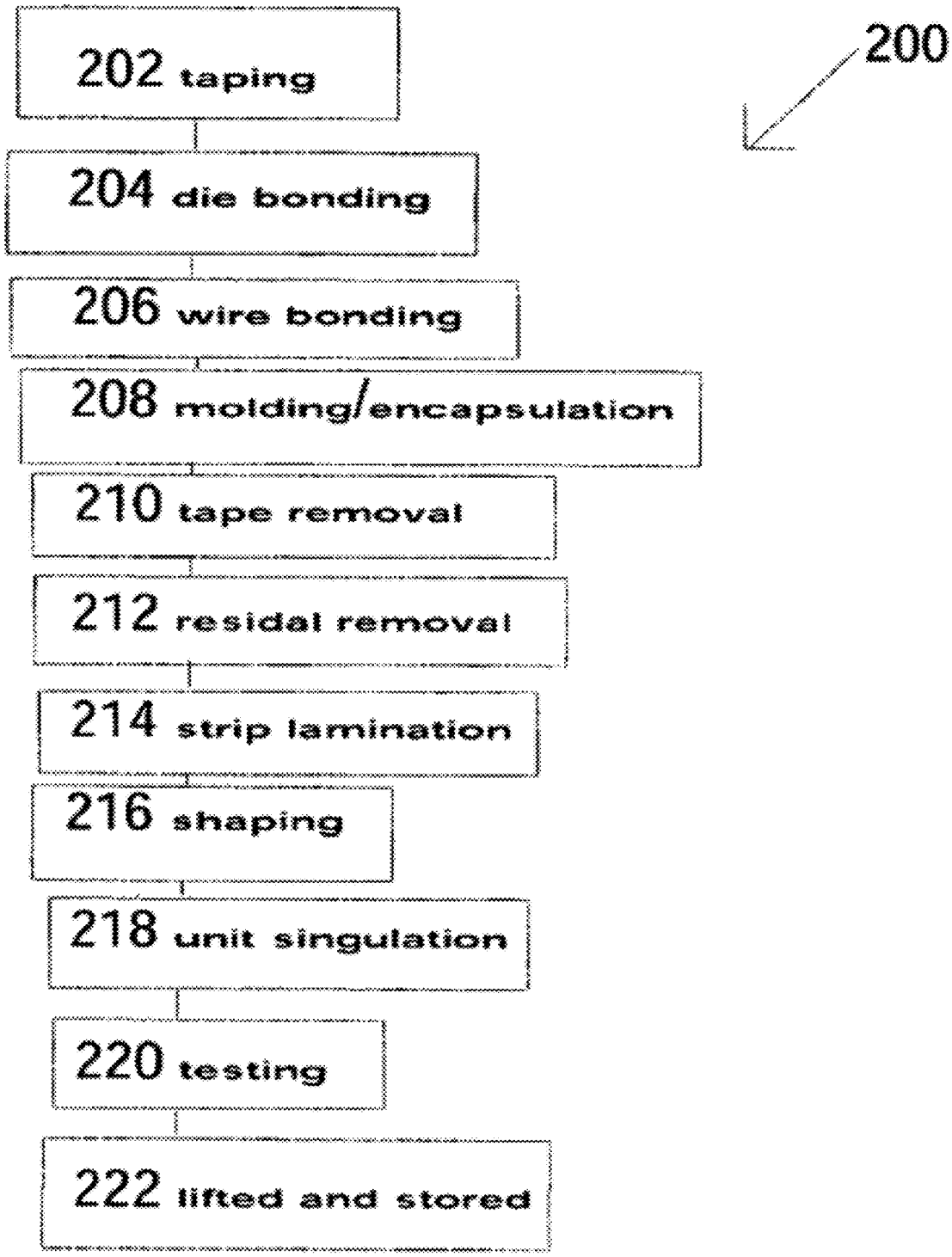
FIG. 2 is a flow diagram of a packaging process according to a first embodiment.

In a first embodiment of the invention, a method 200 packaging is as shown in FIG. 2. The method 200 includes a number of steps, in an example order only. The skilled reader will appreciate that the steps may be performed in other orders and/or further steps may be included in other embodiments depending on the application.

In step 202 the leadframe and diepad are positioned on a tape. In step 204 a QFN die is placed onto the diepad. In step 206 wire bonds are formed between the die contents and the lead lands. In step 208 the die and leadframe are encapsulated. In step 210 the tape is removed. In step 212 the lead tape residues are removed and silver plating is performed. In step 214 strip lamination is performed to form a foil. In step 216 the lead lands and diepad are sawed to form the leads and heat dissipation fins. In step 218 unit singulation is performed. In step 220 the singulated unit is tested. In step 222 the singulated unit is lifted and stored for later use.

Figure 3A:
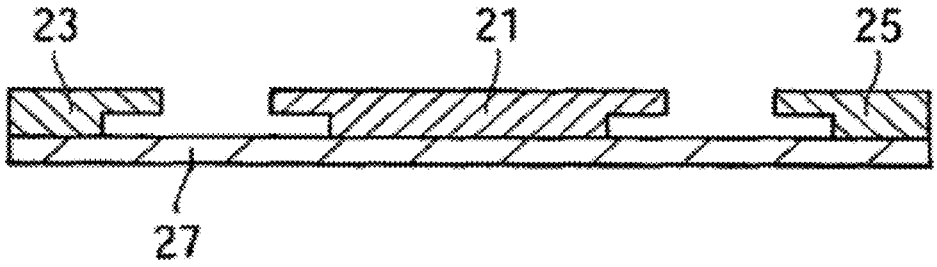
FIG. 3, which is composed of FIGS. 3(a) to 3(k), illustrates the steps of FIG. 2.

The method 200 in FIG. 2 will now be explained in more details with reference to FIG. 3(a) to 3(k). For example, the positioning step 202 may be implemented by a leadframe having a diepad 21 and leads lands 23, 25 positioned on a tape 27, as shown in FIG. 3(a). The construction of the lead lands 23, 25 is discussed below, but they typically extend generally continuously in the direction into the page in FIG. 3(a) by a distance greater than the width of a typical QFN die of the kind used below. The lead lands 23, 25, therefore, extend in a direction parallel to the adjacent side 37 of the diepad 21 as in FIG. 4(c).

Figure 3B:
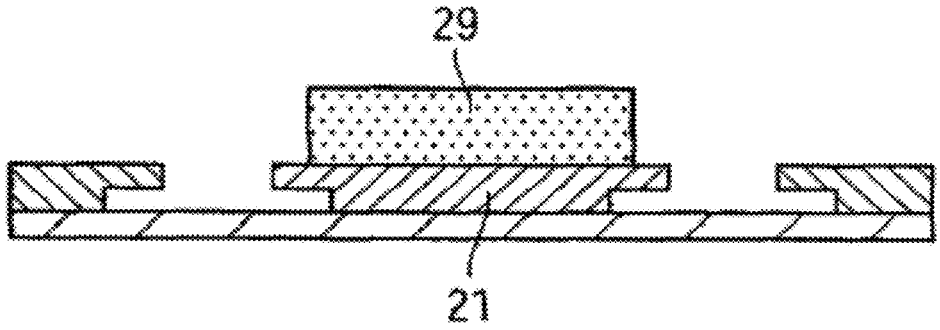

The die bonding step 204 may be implemented by placing a QFN die 29 onto diepad 21, as shown in FIG. 3(b).

Figure 3C:
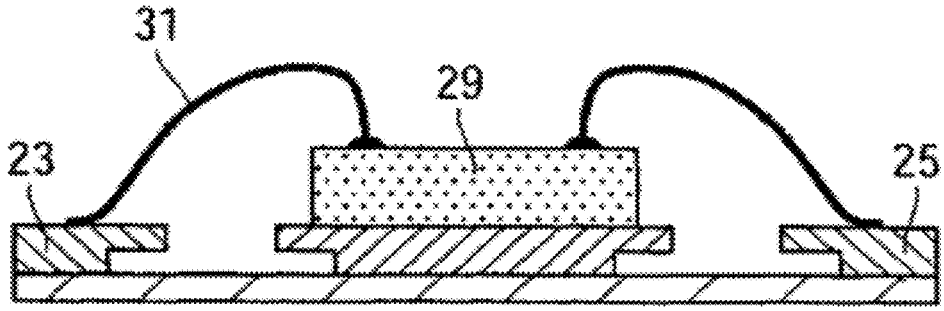

Subsequently, the wire bonding step 206 may be implemented as shown in FIG. 3(c), by forming wire bonds 31 between contacts on the upper surface of the die 29 and the lead lands 23, 25.

Figure 3D:
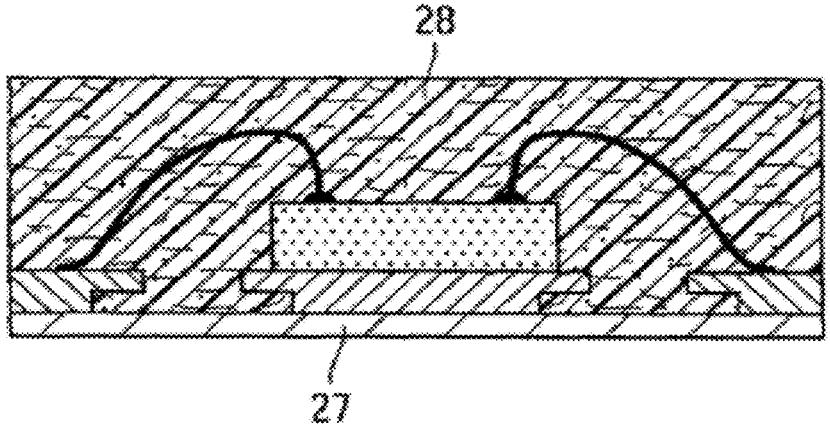

The encapsulation step 208 may be implemented as shown in FIG. 3(d), by molding a resin material 28 to encapsulate the die 29, the leadframe and the wire bonds 31. The resin material 28 is then cured.

Figure 3E:
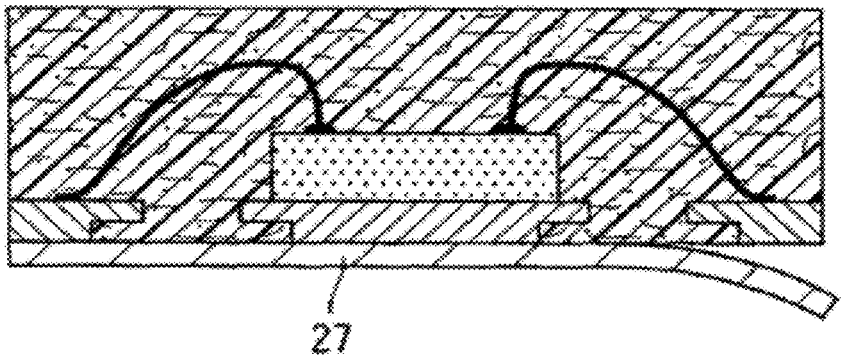
Figure 3F:
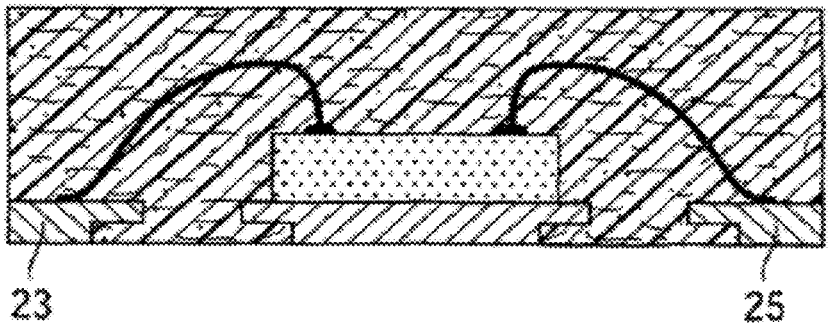

The tape removal step 210 may be implemented as shown in FIG. 3(e), by the tape 27 being removed, resulting in the structure of FIG. 3(f).

The residue removal step 212 may be implemented by the lead tape residues being removed by cleaning, and Ag plating. Note that the lead lands 23, 25 are exposed on the lower surface of the resin material 28.

Figure 3G:
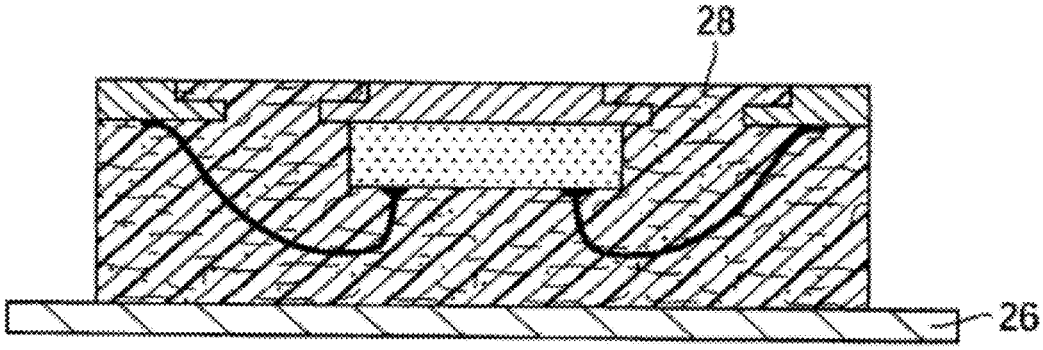

The strip lamination step 214 may be implemented, as shown in FIG. 3(g), by strip lamination being performed to form a foil 26.

Figure 3H:
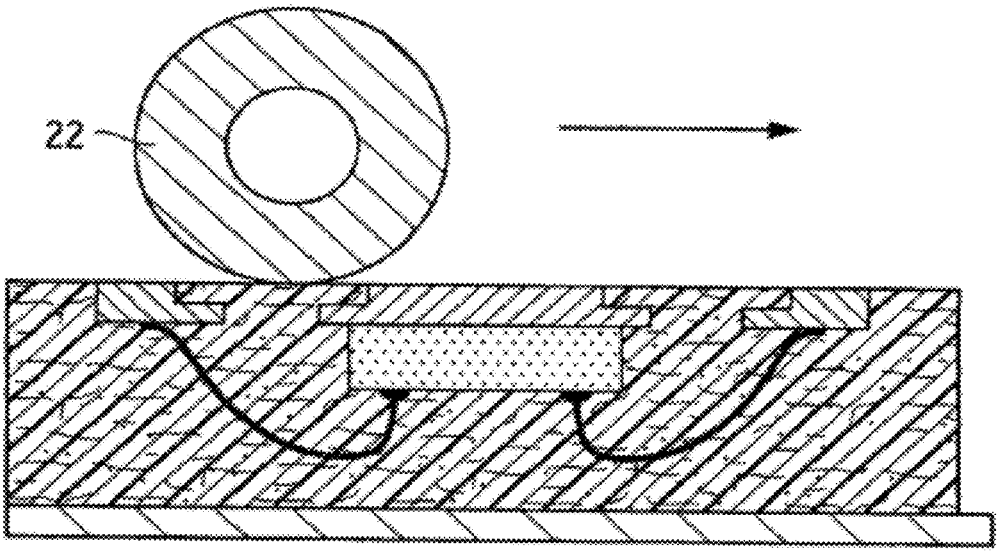

The sawing step 216 may be implemented by one or more locations on the exposed surface of the leadframe being shaped by a sawing process using a rotary blade 22, which advances in the direction of the arrow, as shown in FIG. 3(h). The direction and depth of sawing will be to transversely sever the lead lands into leads, optionally to create heat dissipation fins in the diepad, but without damaging the die. Accordingly lead lands may be lower than the diepad.

The singulation step 218 may be implemented by unit singulation being performed by cutting the resin body 28 to form package units 34.

Figure 3I:
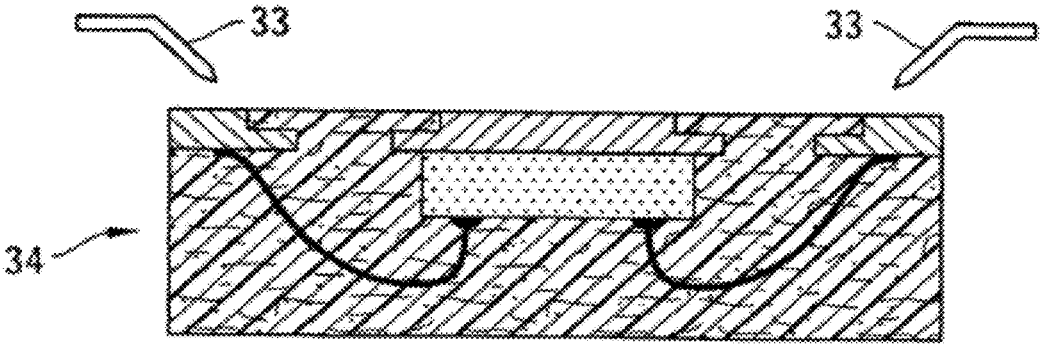

The testing step 220 subsequently, as shown in FIG. 3(i), the singulated unit is tested, using contact pins 33.

Figure 3J:
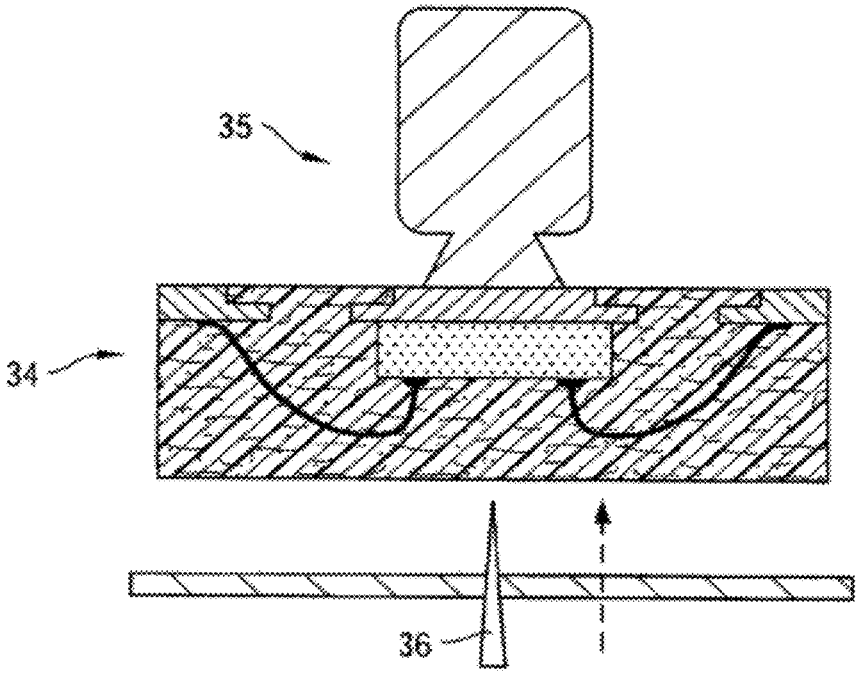
Figure 3K:
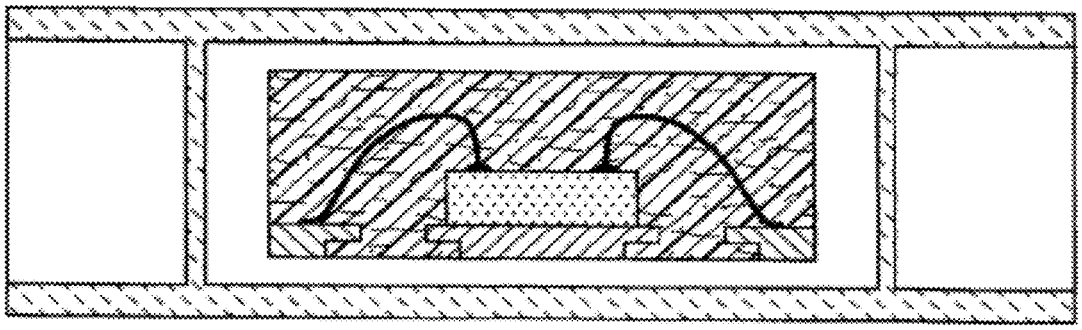

The lifting step 222 may be implemented as shown in FIG. 3(j), by the singulated unit being picked up using a lifter unit 35 and a needle 36, and placed in a desired location (such as part of a reel) for later use, as shown in FIG. 3(k).

Figure 4A:
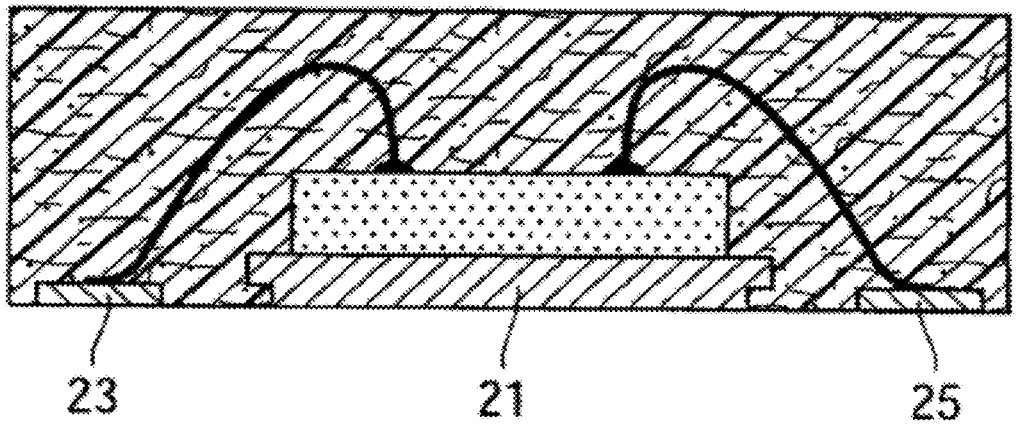
FIG. 4, which is composed of FIGS. 4(a) to 4(e), illustrates a process step of FIG. 3.
Figure 4B:
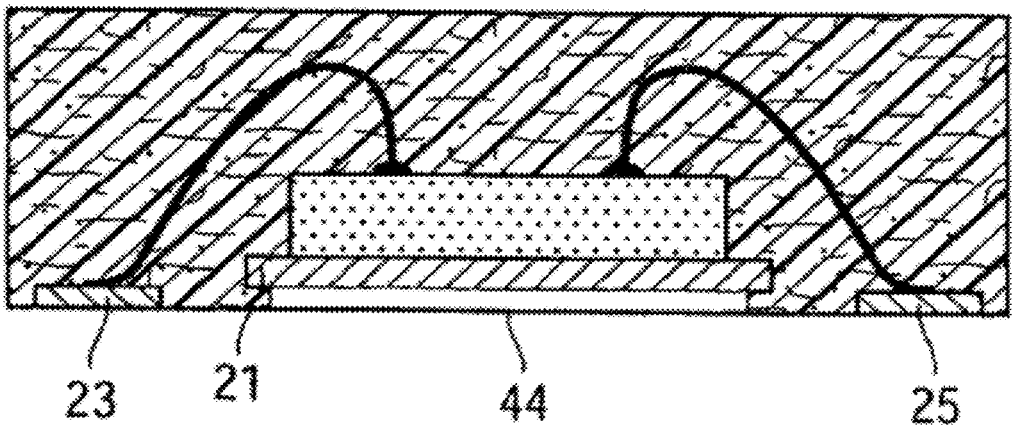
Figure 4C:
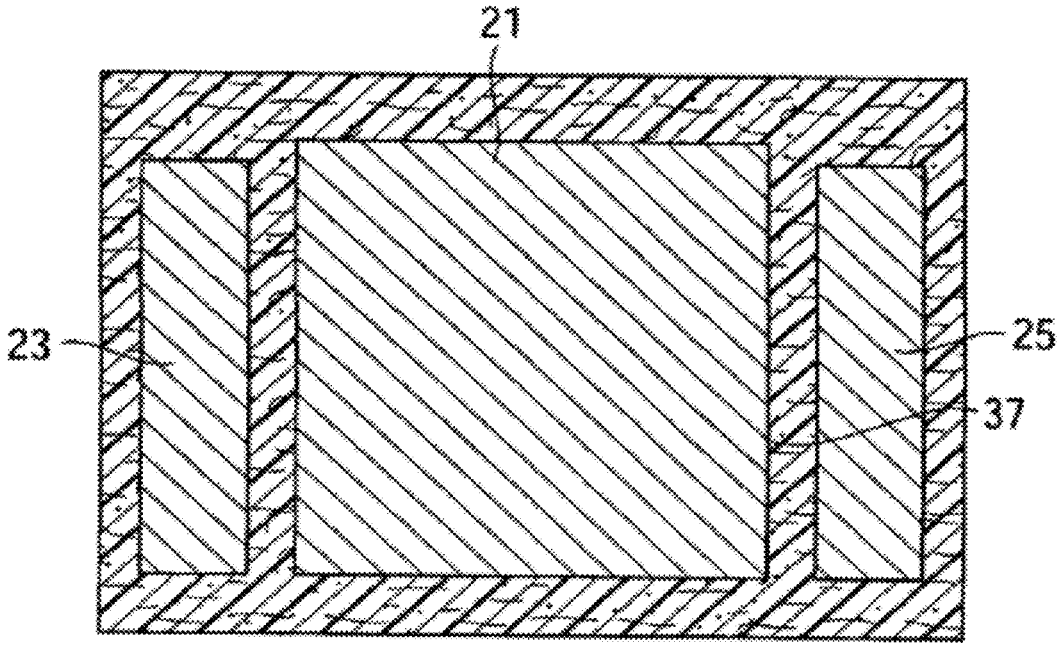
Figure 4D:
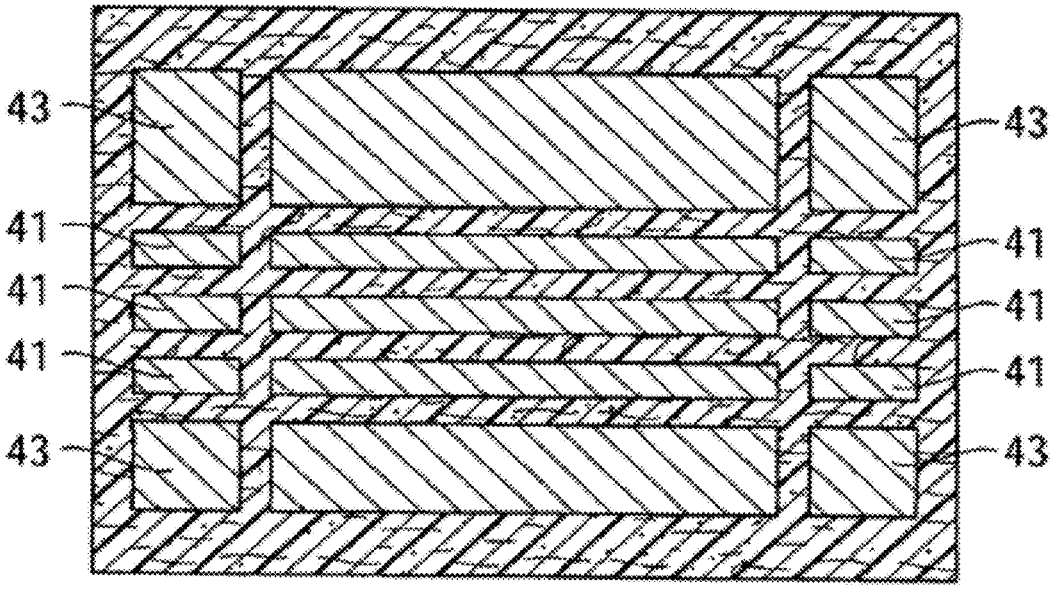
Figure 4E:
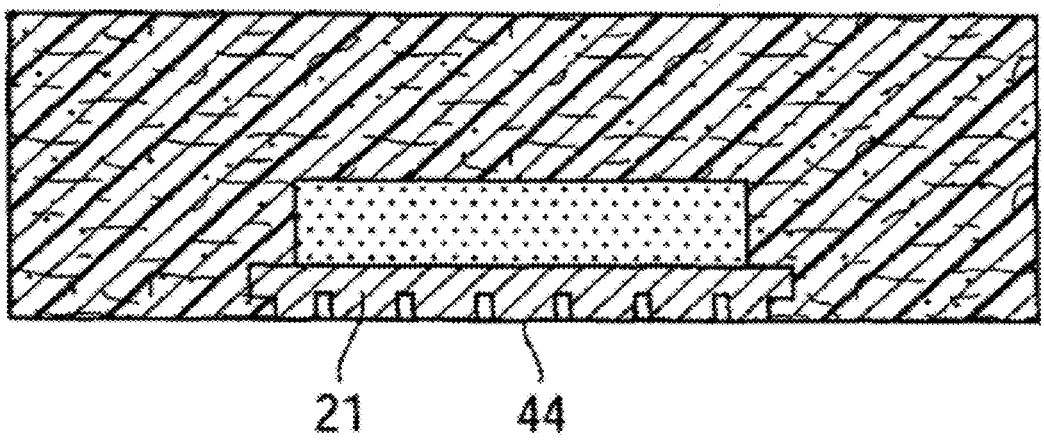

The sawing step 216 shown in FIG. 3(h) will now be described in more detail with reference to FIG. 4(a) to 4(e). FIG. 4(a) is a cross-sectional view of the package before the sawing, while FIG. 4(b) schematically shows the cross-section afterwards. FIG. 4(c) is a bottom view of the package at the stage of FIG. 4(a) (i.e., looking at the exposed surface of the leadframe), while FIG. 4(d) is the same view after the sawing process. During the sawing process a series of parallel lines are cut in the diepad 21 and in the lands 23, 25. FIG. 4(e) is a cross sectional view of the package after sawing perpendicular to FIG. 4(b).

The sawing is perpendicular to the side 37 of the diepad adjacent the lead land 25. The cuts in the lead lands 23, 25, therefore, transversely divide each of the lead lands 23, 25 into five separate electrically isolated leads 41, 43. Note that the pitch of (i.e., spacing between) the five leads produced from each lead land is less than the original pitch of the lead lands 23, 25, so that latter pitch does not need to be particularly low: a pitch of say up to 0.5 mm would be suitable. Such a leadframe can be produced at low cost. Due to the sawing operation, the pitch of the resultant leads 41, 43 can be selected to be any desired value. The leads 41, 43 are shown in FIG. 4(d) as being different sizes, and include flexible pins 41 onto which typically only one wire bond is formed, and one of more large pads 43 onto which multiple wires may be bonded.

The cuts formed by sawing the lower surface of the diepad 21 form a number of grooves (or gaps), and thus shape the lower surface of the diepad 21 into heat sink fins 44, best seen in FIG. 4(e). These grooves are parallel to the direction in which the lead lands 23, 25 are spaced apart, and perpendicular to the side 37 of the diepad adjacent the lead land 25.

While in the first embodiment there is only a single QFN integrated circuit in the completed package 34, in a second embodiment produced by a process shown in FIG. 5(a) to 5(k) there are multiple integrated circuits.

Figure 5A:
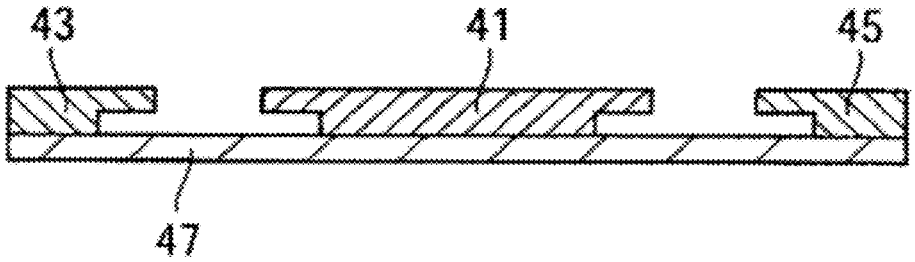
FIG. 5, which is composed of FIGS. 5(a) to 5(k), illustrates the steps of a second embodiment of the invention.
Figure 5B:
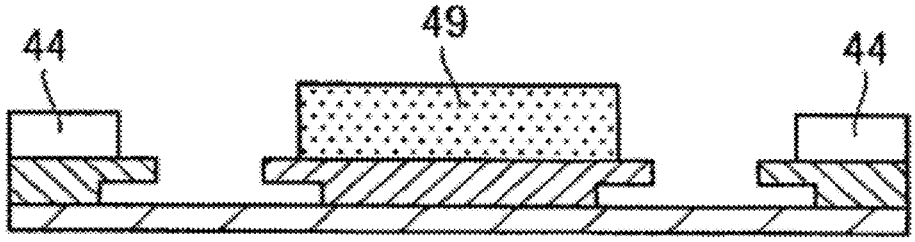

As in the first embodiment, there is an initial step in which a leadframe having a diepad 41 and lead lands 43, 45 is positioned on a tape 47, as shown in FIG. 5(a). Die bonding is then performed to place a QFN die 49 onto diepad 41, as shown in FIG. 5(b). However, at this stage additional dies 44 are placed onto portions of the lead lands 43, 45. The dies 44 do not cover all of the lead lands 43, 45, but only part of them. Typically, they are shorter in the direction into the page than the lead lands 43, 45.

Figure 5C:
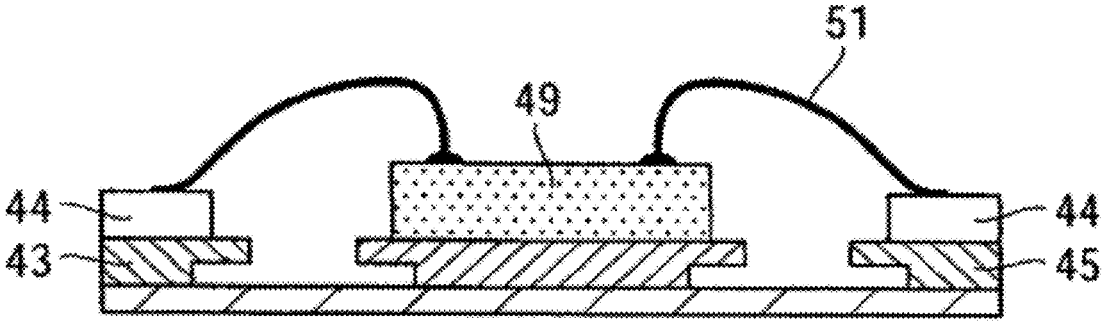
Figure 5D:
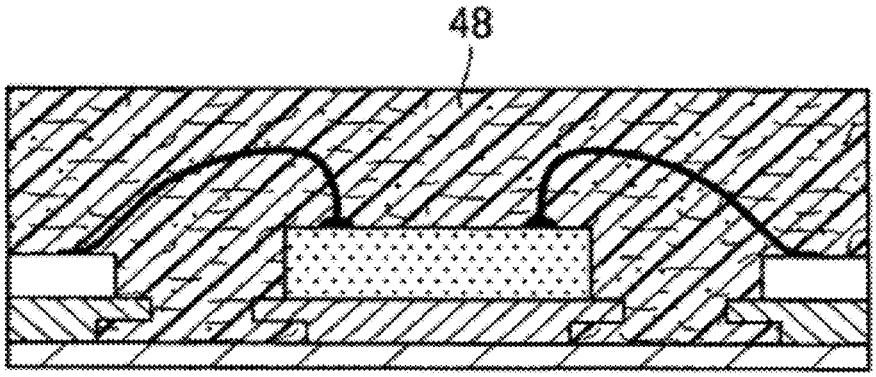
Figure 5E:
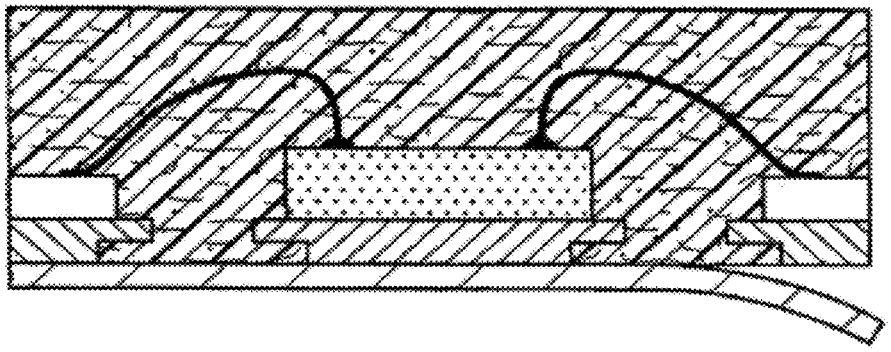
Figure 5F:
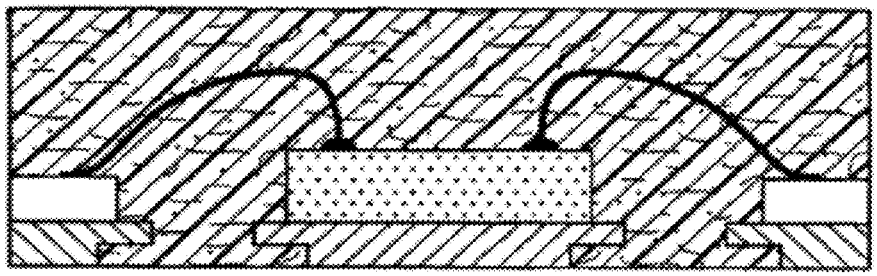
Figure 5G:
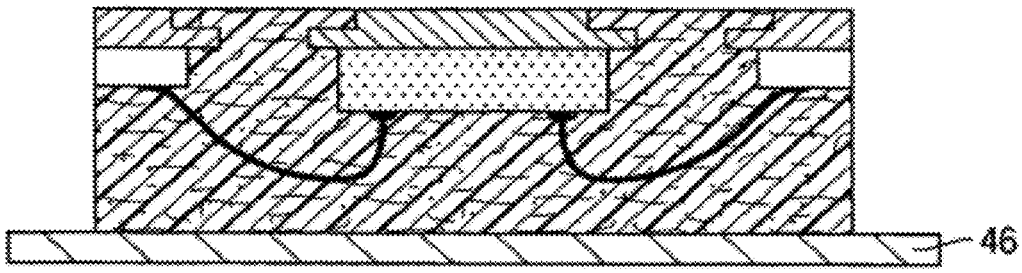

Subsequently, as shown in FIG. 5(c), a wirebonding operation is performed to form wire bonds 51 between contacts on the upper surface of the die 49 and corresponding contacts on the dies 44 and/or lead lands 43, 45. Then, as shown in FIG. 5(d), a molding process is performed in which resin material 48 is formed encapsulating the dies 44, 49 and the wire bonds 51. The resin material 48 is then cured. Then, as shown in FIG. 5(e), the tape 47 is removed, resulting in the structure of FIG. 5(f). At this stage, lead tape residues are removed by cleaning, and Ag plating is performed. Then, as shown in FIG. 5(g), strip lamination is performed to form a foil 46.

Figure 5H:
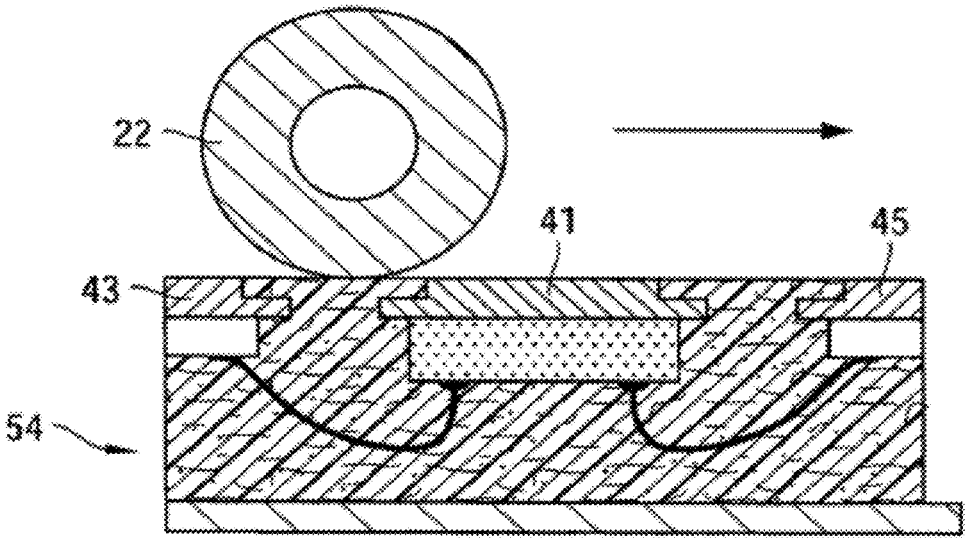
Figure 5I:
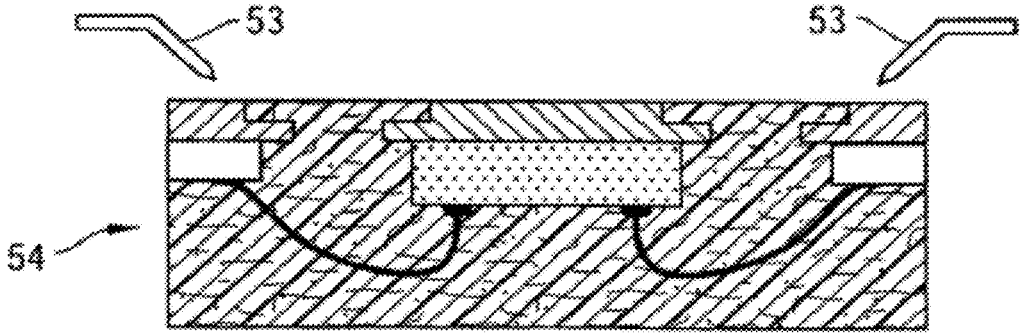
Figure 5J:
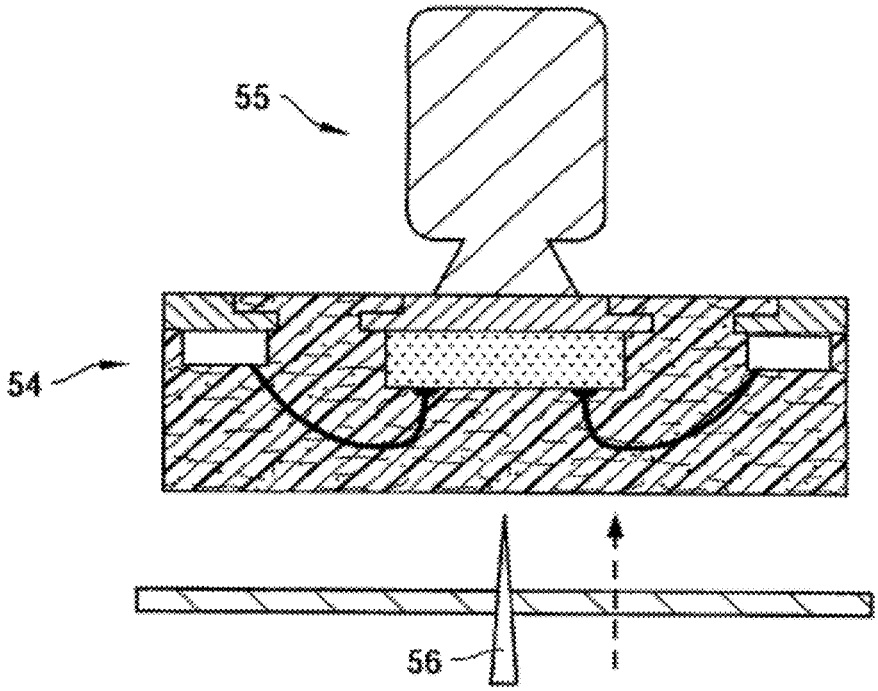
Figure 5K:
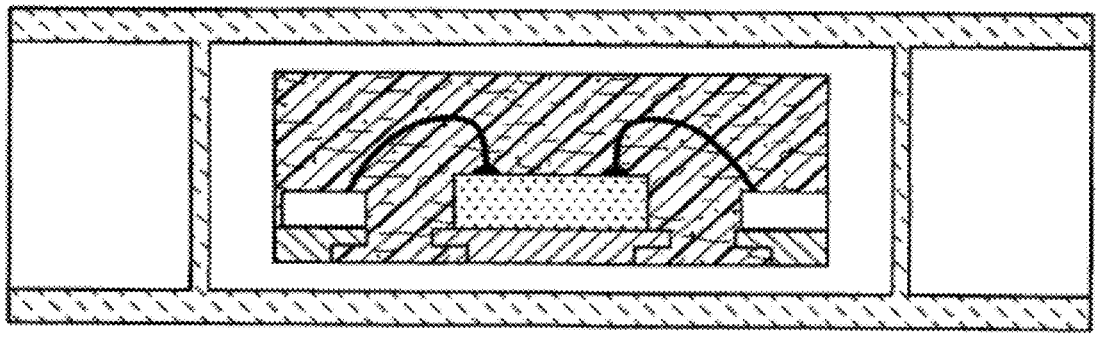

Then a sawing process is performed, as shown in FIG. 5(h), using saw 22 to shape the exposed portions of the lead lands 43, 45 and the diepad 41. Singulation is performed, cutting the resin material 48 into resin bodies. Thus, packages 54 are produced. Subsequently, as shown in FIG. 5(i), each singulated unit 54 is tested, using contact pins 53. Then as shown in FIG. 5(j), it is picked up using a lifter unit 55 and a needle 56, and placed in a desired location for later use as shown in FIG. 5(k).

Figure 6A:
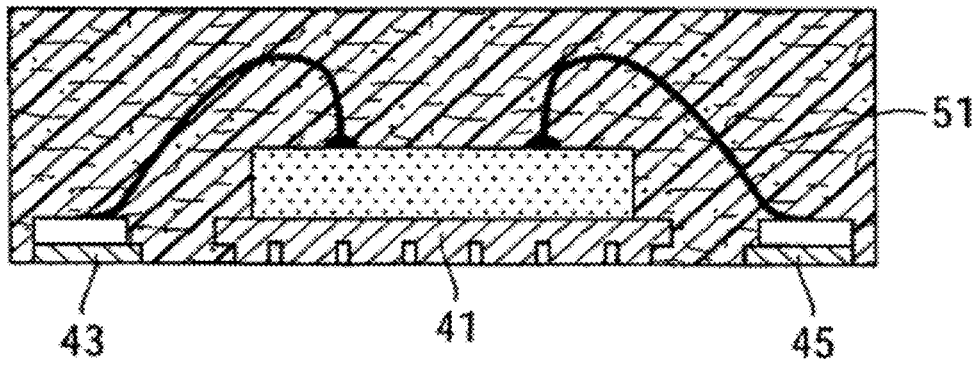
FIG. 6, which is composed of FIGS. 6(a) to 6(c), illustrates a process step of FIG. 5.
Figure 6B:
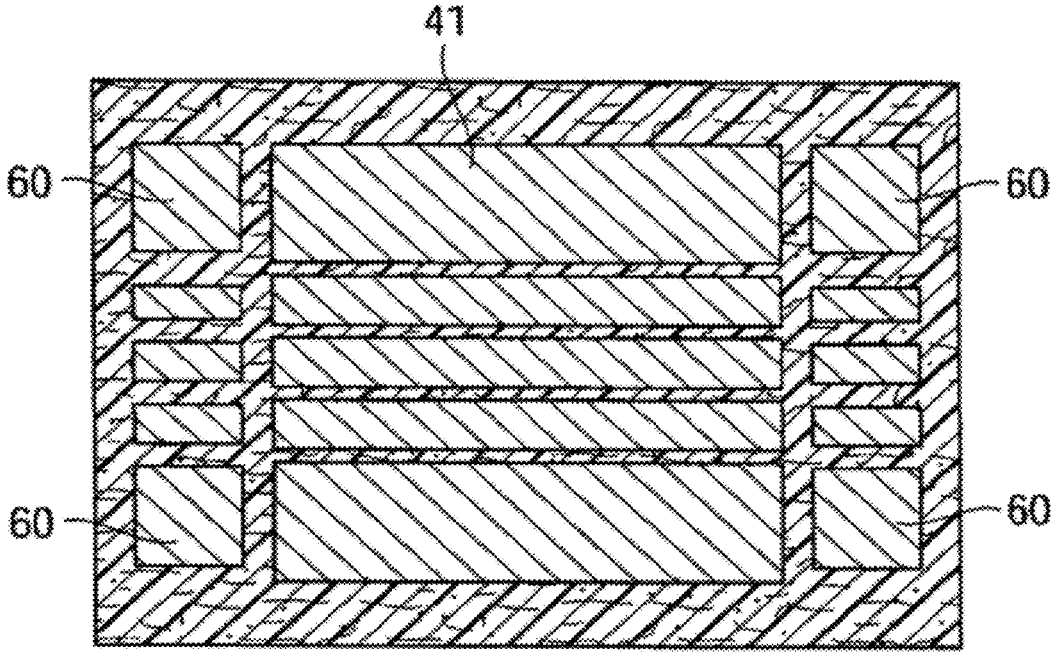
Figure 6C:
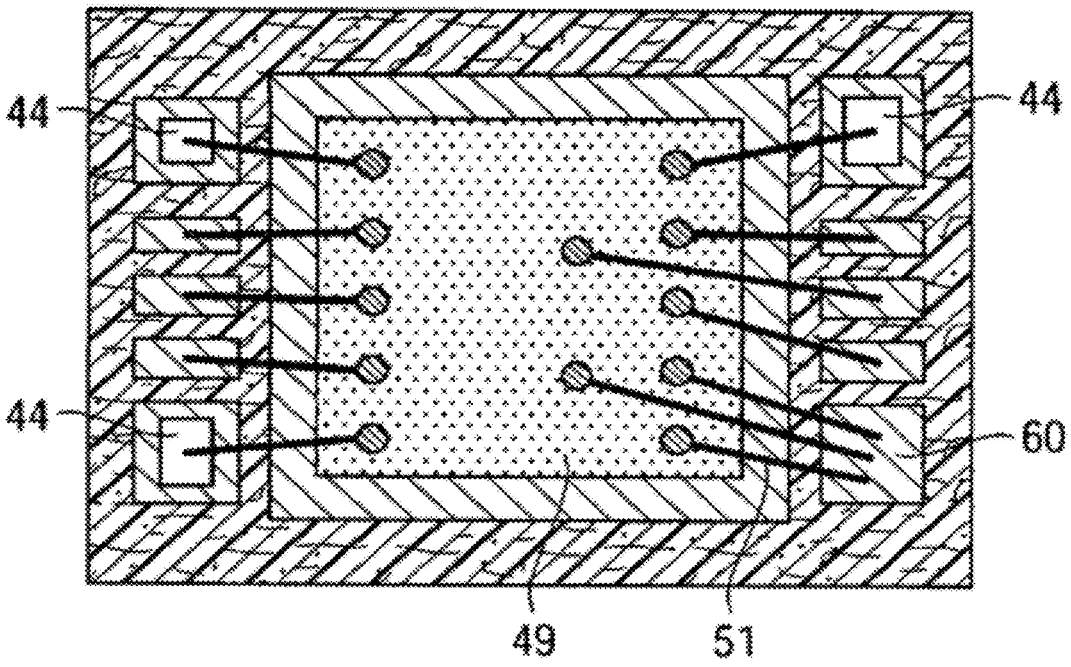

FIG. 6 shows the sawing step of FIG. 5(h) in more detail. FIG. 6(a) is a cross-sectional view of the package after sawing. FIG. 6(b) is a view of the package from below following the sawing operation (before the sawing the bottom view of the package is as in FIG. 4(c)). FIG. 6(c) is a cross-sectional view of the package from above following the sawing operation. This package contains QFN die 49 and three other, smaller dies 44, but any other number of dies is also possible. As will be seen from FIG. 6(c), three of the dies 44 are on respective large pads 60 formed by the cutting of the lead lands 43, 45, while the fourth large pad 60 is used for forming multiple wire bonds to the die 49.

Note that, as in the first embodiment, the lead pitch of the leadframe prior to the sawing does not need to be particularly low: a pitch of say up to 0.5 mm would be suitable. Such a leadframe can be produced at low cost. Due to the sawing operation, the leads are divided, to produce reshaped leads with a small pitch of whatever value is desired in this application. The lower surface of the diepad 41 is shaped to include a number of grooves (or even gaps) which form fins to function as a heat sink for dissipating heat generated by the QFN integrated circuit.

Figure 7A:
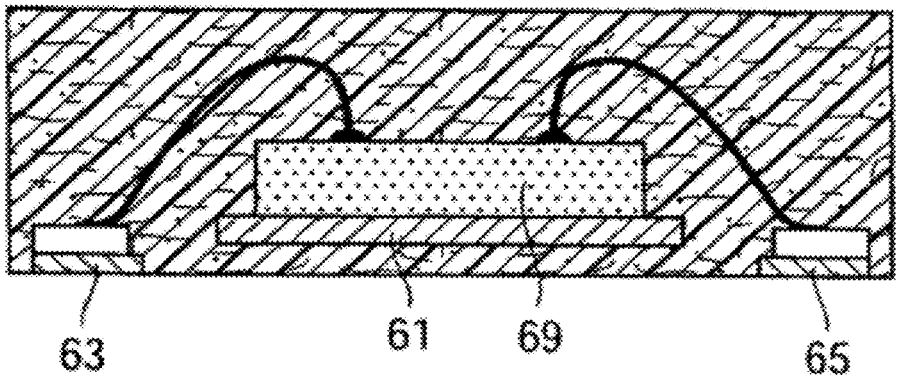
FIG. 7, which is composed of FIGS. 7(a) to 7(c), illustrates a step of a third embodiment of the invention, which is a variant of the embodiment of FIG. 5.
Figure 7B:
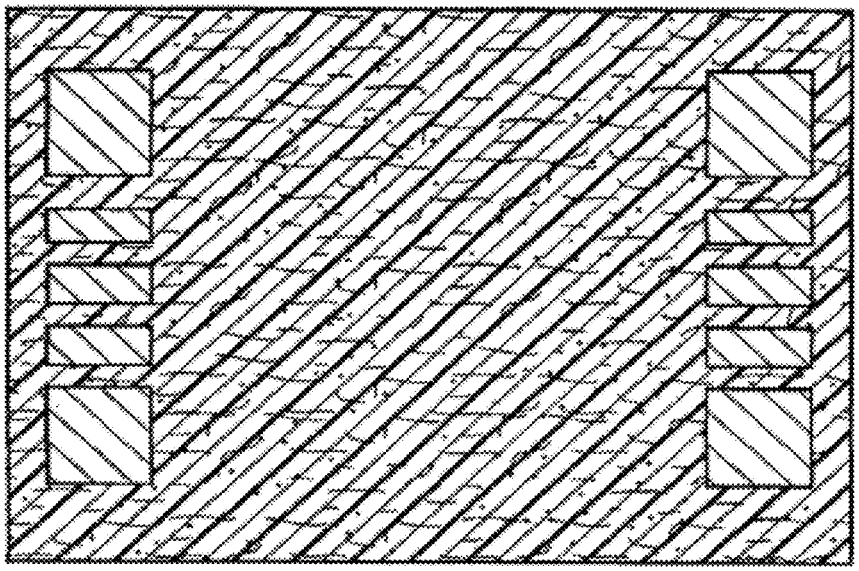
Figure 7C:
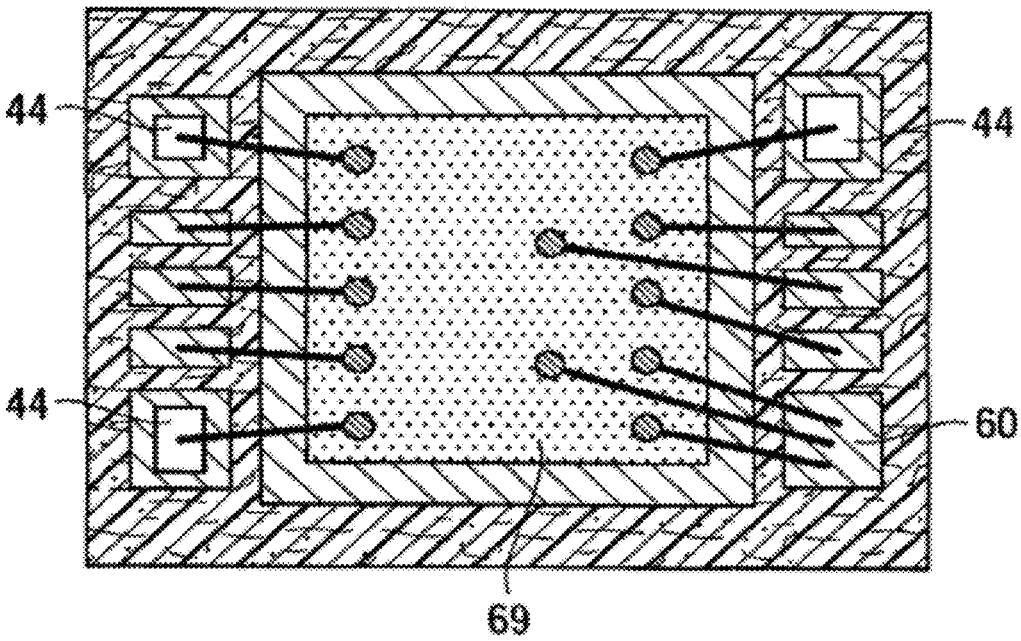

Although the fins of the embodiments of FIGS. 3 and 5 are of benefit, the scope of the invention is not limited to producing packages containing them. Instead, the leadframe may be a sort illustrated in FIG. 7 in which the surface of the diepad 61 away from the QFN die 69 is not coplanar with the surfaces of the lead lands 63, 65. In all other respects this embodiment is just like the second embodiment of the invention. FIG. 7(a) is a cross-sectional view of the package at a process step after the sawing. FIG. 7(b) is a view of the package viewed from below following the sawing operation. FIG. 7(c) is a cross-sectional view of the package from above following the sawing operation. In this embodiment, although the lower surfaces of the lead lands 63, 65 are exposed, and so can be shaped by sawing, the lower surface of the diepad 61 (i.e., the surface away from the die 69) is covered by resin material and so is not shaped, and accordingly does not form a heat sink.

The leadframe used may be of a type as appropriate for a given application. For example, a stamped leadframe may be produced by pressing a sheet of conductive material to remove portions of the sheet. A further example is using an etched leadframe with a single etched lead land instead of individual leads with small and/or custom designed lead pitch. Further examples will be apparent to the skilled reader.

Many variations are possible within the scope of the claims, as will be clear to a skilled reader.

What is claimed is:

1. A method of packaging an integrated circuit, the method comprising:

locating the integrated circuit on a diepad of a leadframe that includes a lead land comprising an adjacent portion that extends in a direction parallel to an adjacent side of the diepad;

forming wire bonds between electrical contacts of the integrated circuit and the lead land of the leadframe;

encapsulating the integrated circuit and the leadframe in a resin material, leaving a portion of the lead land exposed; and after encapsulating, shaping the adjacent portion of the lead land only in a direction substantially perpendicular to the adjacent side of the diepad to divide the lead land into multiple leads bonded to the contacts of the integrated circuit, *the shaping performed on a portion of the lead land directly adjacent to the adjacent side of the diepad*.

2. The method according to claim 1, wherein the shaping is performed by sawing.

3. The method according to claim 1, wherein the shaping further includes shaping at least part of an exposed surface of the diepad to form heat dissipation fins.

4. The method according to claim 1, wherein, after the shaping, singulation is performed in which the resin material and the leadframe are partitioned to form individual integrated circuit packages.

5. The method according to claim 4, wherein, following the singulation, at least one of the individual integrated circuit packages comprise a plurality of integrated circuits.

6. The method according to claim 1, wherein the leadframe comprises a stamped leadframe.

7. The method according to claim 1, wherein the leadframe comprises an etched leadframe.

8. An integrated circuit package produced by a method comprising:

locating the integrated circuit on a diepad of a leadframe that includes a lead land comprising an adjacent portion that extends in a direction parallel to an adjacent side of the diepad;

forming wire bonds between electrical contacts of the integrated circuit and the lead land of the leadframe;

encapsulating the integrated circuit and the leadframe in a resin material, leaving a portion of the lead land exposed; and after encapsulating, shaping the adjacent portion of the lead land only in a direction substantially perpendicular to the adjacent side of the diepad to divide the lead land into multiple leads bonded to the contacts of the integrated circuit, *the shaping performed on a portion of the lead land directly adjacent to the adjacent side of the diepad.*

9. A leadframe for use in a method comprising:

locating an integrated circuit on a diepad of the leadframe that includes a lead land comprising an adjacent portion that extends in a direction parallel to an adjacent side of the diepad;

forming wire bonds between electrical contacts of the integrated circuit and the lead land of the leadframe;

encapsulating the integrated circuit and the leadframe in a resin material, leaving a portion of the lead land exposed; and after encapsulating, shaping the adjacent portion of the lead land only in a direction substantially perpendicular to the adjacent side of the diepad to divide the lead land into multiple leads bonded to the contacts of the integrated circuit, wherein the leadframe includes a diepad region and one or more lead lands extending along a respective side of the diepad region, *and the shaping is performed on a portion of the lead land directly adjacent to the adjacent side of the diepad.*

10. The method according to claim 1, wherein the lead land comprises a plurality of lead lands.

11. The method of claim 1, wherein the integrated circuit comprises a quad-flat non-leaded (QFN) integrated circuit.

12. The method of claim 1, wherein the adjacent portion of the lead land comprises a length in the direction parallel to the adjacent side of the diepad at least twice as long as a width in the direction perpendicular to the adjacent side of the diepad.

13. The integrated circuit package of claim 8, wherein the integrated circuit packages comprises a quad-flat non-leaded (QFN) integrated circuit package.

14. A method of packaging an integrated circuit, the method comprising:

placing the integrated circuit on a diepad of a leadframe comprising a lead land comprising an adjacent portion that extends in a direction parallel to an adjacent side of the diepad;

forming wire bonds between electrical contacts of the integrated circuit and the lead land of the leadframe;

encapsulating the integrated circuit and the leadframe in a resin material, leaving a portion of the lead land exposed; and after encapsulating, sawing the adjacent portion of the lead land only in a direction substantially perpendicular to the adjacent side of the diepad to divide the lead land into multiple leads bonded to the contacts of the integrated circuit, *the sawing performed on a portion of the lead land directly adjacent to the adjacent side of the diepad.*

15. A method of packaging an integrated circuit, the method comprising:

locating the integrated circuit on a diepad of a leadframe that includes a lead land comprising an adjacent portion that extends in a direction parallel to an adjacent side of the diepad, wherein the die pad is separate from the lead land;

forming wire bonds between electrical contacts of the integrated circuit and the lead land of the leadframe;

encapsulating the integrated circuit and the leadframe in a resin material, leaving a portion of the lead land exposed; and after encapsulating, shaping the adjacent portion of the lead land only in a direction substantially perpendicular to the adjacent side of the diepad to divide the lead land into multiple leads bonded to the contacts of the integrated circuit, *the shaping performed on a portion of the lead land directly adjacent to the adjacent side of the diepad.*

16. The method according to claim 15, wherein shaping is performed by sawing.

17. The method according to claim 15, wherein, after the shaping, singulation is performed in which the resin material and the leadframe are partitioned to form individual integrated circuit packages.

18. A method of packaging an integrated circuit, the method comprising:

placing the integrated circuit on a diepad of a leadframe comprising a lead land comprising an adjacent portion that extends in a direction parallel to an adjacent side of the diepad;

forming wire bonds between electrical contacts of the integrated circuit and the lead land of the leadframe;

encapsulating the integrated circuit and the leadframe in a resin material, leaving a portion of the lead land exposed; and after encapsulating, making cuts in the adjacent portion of the lead land only in a direction substantially perpendicular to the adjacent side of the diepad, wherein multiple respective leads are formed between the cuts, *the making cuts performed on a portion of the lead land directly adjacent to the adjacent side of the diepad.*

19. The method of claim 18, wherein making cuts in the lead land comprises sawing the lead land.

*20. A method of packaging an integrated circuit, the method comprising:*

*locating the integrated circuit on a diepad of a leadframe that includes a lead land comprising an adjacent portion that extends in a direction parallel to an adjacent side of the diepad;*

*forming wire bonds between electrical contacts of the integrated circuit and the lead land of the leadframe;*

*encapsulating the integrated circuit and the leadframe, leaving a portion of the lead land exposed; and*

*after encapsulating, shaping the adjacent portion of the lead land only in a direction substantially perpendicular to the adjacent side of the diepad to divide the lead land into multiple leads bonded to the contacts of the integrated circuit, the shaping performed on a portion of the lead land directly adjacent to the adjacent side of the diepad.*

* * * * *